(12) United States Patent
Yagi et al.

(10) Patent No.: US 7,665,224 B2
(45) Date of Patent: Feb. 23, 2010

(54) METHOD OF MEASURING METAL TERMINAL AND APPARATUS FOR MEASURING THE SAME

(75) Inventors: Satoshi Yagi, Makinohara (JP); Osamu Murata, Makinohara (JP); Tetsuro Ide, Makinohara (JP); Hideto Kumakura, Makinohara (JP); Kenji Suzuki, Makinohara (JP); Koji Higuchi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 216 days.

(21) Appl. No.: 11/969,939

(22) Filed: Jan. 7, 2008

(65) Prior Publication Data

US 2008/0172898 A1 Jul. 24, 2008

(30) Foreign Application Priority Data

Jan. 18, 2007 (JP) ............................. 2007-009130
Jan. 18, 2007 (JP) ............................. 2007-009138

(51) Int. Cl.
*G01B 5/00* (2006.01)

(52) U.S. Cl. ............................. 33/804; 33/805; 33/783

(58) Field of Classification Search .................. 33/783, 33/804, 805, 832, 833, 545, 533, 784
See application file for complete search history.

(56) References Cited

U.S. PATENT DOCUMENTS 4,856,186 A * 8/1989 Yeomans .................... 29/863
5,375,341 A * 12/1994 College et al. ................ 33/804
5,421,101 A * 6/1995 Rank ........................... 33/831
5,570,514 A * 11/1996 Hashimoto et al. ........... 33/784
7,010,864 B2 * 3/2006 Murakami .................... 33/533

FOREIGN PATENT DOCUMENTS

JP 2000-207956 A 7/2000

* cited by examiner

*Primary Examiner*—G. Bradley Bennett
*Assistant Examiner*—Tania C Courson
(74) *Attorney, Agent, or Firm*—Sughrue Mion, PLLC

(57) ABSTRACT

An apparatus for measuring a metal terminal includes a crimping unit which crimps core wire crimping piece portions to a core wire of a sheathed electric wire to form a core wire crimping portion and crimps sheath crimping piece portions to a sheath portion of the sheathed electric wire to form a sheath crimping portion, a gripping member which grips the core wire crimping portion in a direction perpendicular to an extending direction of a base plate portion of the metal terminal, and a measuring unit which measures a dimension of the core wire crimping portion and a dimension of the sheath crimping portion. A height of the sheath crimping portion is measured in a direction intersecting with or parallel to the direction of gripping of the core wire crimping portion in a state that the core wire crimping portion is gripped in a direction perpendicular to an extending direction of the base plate portion.

14 Claims, 6 Drawing Sheets

METHOD OF MEASURING METAL TERMINAL AND APPARATUS FOR MEASURING THE SAME

BACKGROUND

This invention relates to a method of and an apparatus for measuring a metal terminal crimped to a sheathed wire.

In the production of a wire-connected metal terminal, generally, a sheath is removed from an end portion of a sheathed wire, and then the metal terminal is crimped to an exposed portion of a core wire (conductor) and that portion of the sheath disposed adjacent to this exposed core wire portion.

The metal terminal includes two pairs of crimping piece portions, each pair of crimping piece portions extending upwardly respectively from opposite side edges of a base plate portion for the placing of the sheathed wire thereon. More specifically, there are provided the pair of sheath crimping piece portions to be press-fastened to the sheath and the pair of core wire crimping piece portions to be press-fastened to the core wire.

A crimping machine for crimping the metal terminal to the sheathed wire includes a die for press-deforming the crimping piece portions of the metal terminal. The die comprises an anvil for the placing of the base plate portion of the metal terminal thereon, and a crimper which cooperates with the anvil to press-deform the crimping piece portions of the metal terminal.

The metal terminal is pressed between the anvil and the crimper of the crimping machine, and is crimped to the sheathed wire in such a manner that the pair of sheath crimping piece portions are press-fastened to the sheath, while the pair of core wire crimping piece portions are press-fastened to the core wire.

After the metal terminal is crimped to the sheathed wire, a contact resistance between the core wire and the metal terminal and a force (strength) of clamping of the metal terminal to the sheathed wire are evaluated. These evaluations have heretofore been manually conducted for selected samples, using an ohm-meter and a tensile tester. However, there has now been proposed an automatic evaluation apparatus for measuring a resistance value and a tensile strength for all of wire-connected metal terminals (see, for example, JP-A-2000-207956).

Here, a height of a core wire crimping portion formed by the pair of core wire crimping piece portions press-fastened to the core wire is defined as its dimension in a direction perpendicular to the base plate portion, and it is known that this height is an important index related to the contact resistance between the core wire and the metal terminal and the force (strength) of clamping of the metal terminal to the sheathed wire.

In the automatic evaluation apparatus disclosed in JP-A-2000-207956, a resistance value, a tensile strength and a height of the core wire crimping portion are measured for each metal terminal, and the optimum height of the core wire crimping portion is determined from statistics of measured values so that the resistance and the tensile strength both can take proper values within the standard range, and the distance between an anvil and a crimper is automatically adjusted so that the core wire crimping portion can be formed into the proper height.

The metal terminal is crimped to the sheathed wire in such a manner that the pair of core wire crimping piece portions are press-fastened to the core wire and that the pair of sheath crimping piece portions are press-fastened to the sheath. Therefore, the clamping force of the metal terminal is obtained also by the pair of sheath crimping piece portions press-fastened to the sheath.

In the automatic evaluation apparatus disclosed in JP-A-2000-207956, only the height of the core wire crimping portion formed by the pair of core wire crimping piece portions press-fastened to the core wire is measured and evaluated, and the height of a sheath crimping portion formed by the pair of sheath crimping piece portions press-fastened to the sheath is not measured and evaluated.

In some cases, the pair of sheath crimping piece portions are press-fastened to the sheath in such a manner that one of these sheath crimping piece portion overlaps the other. In such a case, the resultant sheath crimping portion has a generally round cross-sectional shape, and a portion (measurement portion) of the sheath crimping portion to be measured can not be easily determined, and an overlapping portion and a non-overlapping portion adjacent thereto much differ in height from each other.

Therefore, for measuring and evaluating the height of the sheath crimping portion, it is necessary to establish standards for determining a measurement portion common to all of metal terminals to be subjected to measurement.

SUMMARY

This invention has been made in view of the above circumstances, and an object of the invention is to provide a method of and an apparatus for measuring a metal terminal, in which a height of a sheath crimping portion can be measured in a stable manner, thereby enhancing the quality of the wire-connected metal terminal.

The above object has been achieved by a metal terminal measuring method of the present invention recited in the following Paragraphs (1) to (7) and a metal terminal measuring apparatus of the invention recited in the following Paragraphs (8) to (14).

(1). A method of measuring a metal terminal, comprising:

providing a metal terminal which includes a base plate portion for placing a sheathed electric wire thereon, a pair of core wire crimping piece portions extending upwardly respectively from opposite side edges of the base plate portion, and a pair of sheath crimping piece portions extending upwardly respectively from the opposite side edges of the base plate portion; and crimping the core wire crimping piece portions to a core wire of the sheathed electric wire to form a core wire crimping portion;

crimping the sheath crimping piece portions to a sheath portion of the sheathed electric wire to form a sheath crimping portion;

measuring a dimension of the core wire crimping portion and a dimension of the sheath crimping portion, wherein a height of the sheath crimping portion is measured in a direction intersecting with or parallel to a direction of gripping of the core wire crimping portion in a state that the core wire crimping portion is gripped in a direction perpendicular to an extending direction of the base plate portion.

(2). The method according to paragraph (1), wherein when the sheath crimping portion is formed, one of the sheath crimping piece portions is overlapped to the other of the sheath crimping piece portions.

(3). The method according to, wherein a bell mouth portion is formed at an end portion of the core wire crimping portion in an axis direction of the sheathed electric wire; and wherein a positioning of the metal terminal is determined by gripping the core wire crimping portion with a gripping member so as to abut against the bell mouth portion.

(4). The method according to paragraph (1), wherein the base plate portion is formed into a curved shape in a cross-section perpendicular to an axis direction of the sheathed electric wire;

wherein the core wire crimping portion is gripped by a gripping member;

wherein the gripping member includes a concave groove having a shape conforming to the curved shape of the base plate portion; and wherein a positioning of the metal terminal is determined by contacting the concave groove of the gripping member to the base plate portion.

(5). The method according to paragraph (1), wherein the measuring process includes:

measuring a height of the core wire crimping portion while gripping the core wire crimping portion in the direction perpendicular to the extending direction of the base plate portion; and measuring the height of the sheath crimping portion in the direction intersecting with or parallel to the direction of gripping of the core wire crimping portion in the state that the core wire crimping portion is gripped in the measuring process of the height of the core wire crimping portion.

(6). The method according to paragraph (1), wherein when it is detected in the crimping process that a back burr is formed on the metal terminal, an operation of the crimping process is stopped.

(7). The method according to paragraph (1), wherein when the height of at least one of the core wire crimping portion and the sheath crimping portion does not meet a predetermined standard requirement, an operation of the crimping process is stopped.

(8). An apparatus for measuring a metal terminal including a base plate portion for placing a sheathed electric wire thereon, a pair of core wire crimping piece portions extending upwardly respectively from opposite side edges of the base plate portion, and a pair of sheath crimping piece portions extending upwardly respectively from the opposite side edges of the base plate portion; the apparatus comprising:

a crimping unit which crimps the core wire crimping piece portions to a core wire of a sheathed electric wire to form a core wire crimping portion and crimps the sheath crimping piece portions to a sheath portion of the sheathed electric wire to form a sheath crimping portion;

a gripping member which grips the core wire crimping portion in a direction perpendicular to an extending direction of the base plate portion; and a measuring unit which measures a dimension of the core wire crimping portion and a dimension of the sheath crimping portion, wherein a height of the sheath crimping portion is measured in a direction intersecting with or parallel to the direction of gripping of the core wire crimping portion in a state that the core wire crimping portion is gripped in a direction perpendicular to an extending direction of the base plate portion.

(9). The measuring apparatus according to paragraph (8), wherein one of the sheath crimping piece portions in the sheath crimping portion is overlapped to the other of the sheath crimping piece portions.

(10). The measuring apparatus according to paragraph (8), wherein the gripping member has an abutment portion which abuts against a bell mouth portion which is formed at an end portion of the core wire crimping portion in an axis direction of the sheathed electric wire.

(11). The measuring apparatus according to paragraph (8), wherein the gripping member includes a concave groove having a shape conforming to a curved shape of the base plate portion which is formed into a curved shape in a cross-section perpendicular to an axis direction of the sheathed electric wire.

(12). The measuring apparatus according to paragraph (8), wherein the measuring unit includes:

a first measuring portion which measures a height of the core wire crimping portion while gripping the core wire crimping portion in the direction perpendicular to the extending direction of the base plate portion; and a second measuring portion which measures the height of the sheath crimping portion in the direction intersecting with or parallel to the direction of gripping of the core wire crimping portion in the state that the core wire crimping portion is gripped in the measuring process of the height of the core wire crimping portion.

(13). The measuring apparatus according to paragraph (8), wherein when it is detected in the crimping process that a back burr is formed on the metal terminal, an operation of the crimping unit is stopped.

(14). The measuring apparatus according to paragraph (8), wherein when the height of at least one of the core wire crimping portion and the sheath crimping portion does not meet a predetermined standard requirement, an operation of the crimping unit is stopped.

The height of the core wire crimping portion is defined as its dimension in the direction perpendicular to the base plate portion, and the height of the core wire crimping portion 43 is measured while the core wire crimping portion 43 is gripped in the direction perpendicular to the base plate portion. Here, base plate portions of all of metal terminals to be subjected to measurement have the same shape, and therefore the metal terminals, each having the core wire crimping portion gripped in the direction perpendicular to the base plate portion, are all held in the same posture. In the condition in which the core wire crimping portion is gripped in the direction perpendicular to the base plate portion, the height of the sheath crimping portion is measured in the direction intersecting the direction of gripping of the core wire crimping portion at the predetermined angle or disposed parallel to this gripping direction. By doing so, a portion (measurement portion) of the sheath crimping portion to be measured can be standardized for all of the metal terminals to be subjected to measurement. Therefore, the measurement of the height of the sheath crimping portion can be effected in a stable manner, and a clamping force of the wire-connected metal terminal can be properly evaluated so as to enhance the quality of the wire-connected metal terminal.

The pair of sheath crimping piece portions are press-fastened to the sheath of the sheathed wire in such a manner that one of the sheath crimping piece portions overlaps the other. In this case, the sheath crimping portion formed by the pair of sheath crimping piece portions press-fastened to the sheath has a generally round shape in a cross-section perpendicular to the axial of the sheathed wire. However, the height of the sheath crimping portion is measured in the condition in which the core wire crimping portion is gripped, and therefore the portion (measurement portion) of the sheath crimping portion to be measured can be standardized for all of the metal terminals to be subjected to measurement. Therefore, the measurement of the height of the sheath crimping portion can be effected in a stable manner, and this is desirable.

When the formation of a back burr on the metal terminal is confirmed, the operation of the crimping machine (or the crimping step) is stopped, and a necessary operation can be effected such for example as an operation for adjusting a gap between a crimper and an anvil of the crimping machine, and therefore the quality of the wire-connected metal terminal can be further enhanced, and this is desirable.

Furthermore, when the height of at least one of the core wire crimping portion and the sheath crimping portion is outside the predetermined standard range, the operation of the crimping machine (or the crimping step) is stopped, and a necessary operation can be effected such for example as the operation for adjusting the gap between the crimper and the anvil of the crimping machine, and therefore the clamping force of the wire-connected metal terminal can be properly evaluated so as to further enhance the quality of the wire-connected metal terminal, and this is desirable.

Incidentally, the measuring device may be provided with control means for automatically feeding a signal for stopping the operation of the crimping machine when the formation of a back burr on the metal terminal is confirmed or when the height of at least one of the core wire crimping portion and the sheath crimping portion is outside the predetermined standard range.

Base plate portions of all of metal terminals to be subjected to measurement have the same shape, and therefore the metal terminals, each having the core wire crimping portion gripped in the direction perpendicular to the base plate portion, are all held in the same posture. In the condition in which the core wire crimping portion is gripped in the direction perpendicular to the base plate portion, the height of the sheath crimping portion is measured in the direction intersecting the direction of gripping of the core wire crimping portion at the predetermined angle or disposed parallel to this gripping direction. By doing so, a portion (measurement portion) of the sheath crimping portion to be measured can be standardized for all of the metal terminals to be subjected to measurement. Therefore, the measurement of the height of the sheath crimping portion can be effected in a stable manner, and a clamping force of the metal terminal can be properly evaluated so as to more accurately control the quality of the crimping.

The height of the core wire crimping portion is defined as its dimension in the direction perpendicular to the base plate portion, and the height of the core wire crimping portion can also be measured when the core wire crimping portion is gripped in the direction perpendicular to the base plate portion, and by doing so, the time and labor are reduced, and therefore this is desirable.

Generally, in order to prevent the core wire from being damaged by the pair of core wire crimping piece portions press-fastened thereto, each of the opposite end portions of each core wire crimping piece portion of the core wire crimping portion is formed into a flaring shape, so that the bell mouth portions are formed respectively at the opposite end portions of the core wire crimping portion spaced from each other in the axial direction of the sheathed wire. When the core wire crimping portion is gripped by the gripping member, the gripping member abuts against the bell mouth portions. By doing so, the positioning of the metal terminal in the axial direction of the sheathed wire can be effected, and this is desirable.

Furthermore, the base plate portion of the metal terminal is formed into the curved shape in the cross-section perpendicular to the axis of the sheathed wire, and the concave groove conforming in shape (curved shape) to the base plate portion is formed at the surface of the gripping member (for gripping the core wire crimping portion) for contact with the base plate portion. When measuring the height while the gripping member grips the core wire crimping portion, the base plate portion and the concave groove are fitted together in a complementary manner. By doing so, the positioning of the metal terminal in the direction perpendicular to the axis of the sheathed wire can be effected, and this is desirable.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

A preferred embodiment of the present invention will now be described with reference to the drawings.

Figure 1:
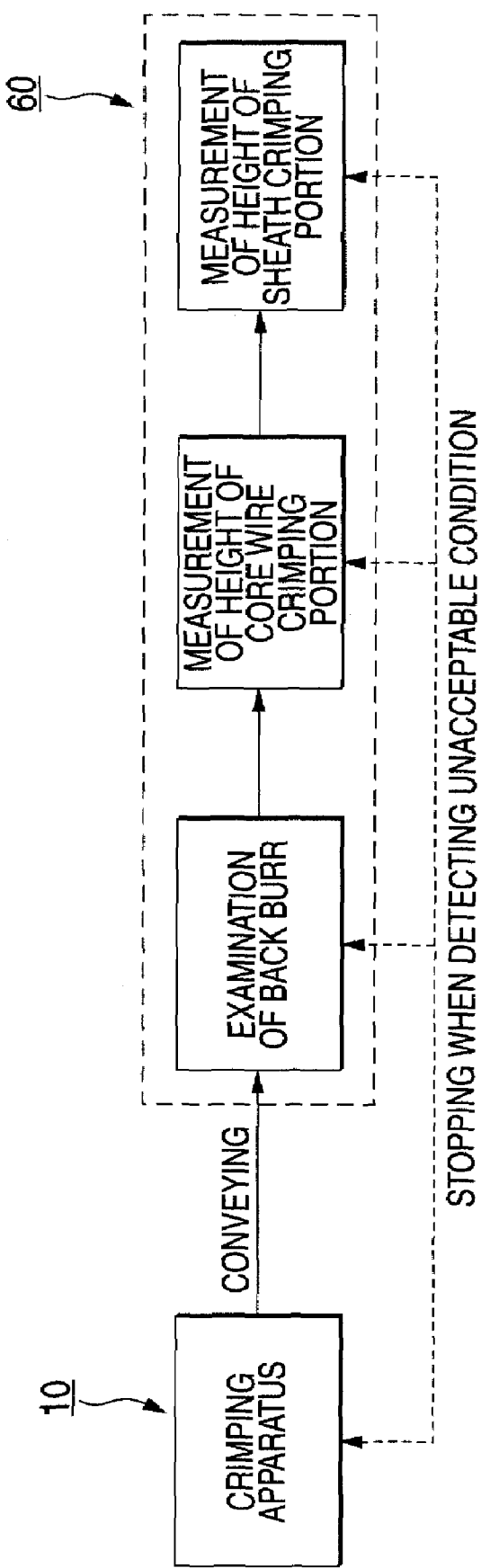
FIG. 1 is a block diagram broadly showing the construction of one preferred embodiment of a wire-connected metal terminal measuring apparatus of the present invention.

As shown in FIG. 1, the wire-connected metal terminal measuring apparatus of this embodiment comprises the crimping apparatus 10 for crimping the metal terminal to the sheathed wire, and the measuring device 60 for receiving the metal terminal crimped by the crimping apparatus 10 to the sheathed wire (electric wire) and for measuring dimensions, etc., of the metal terminal.

Figure 2:
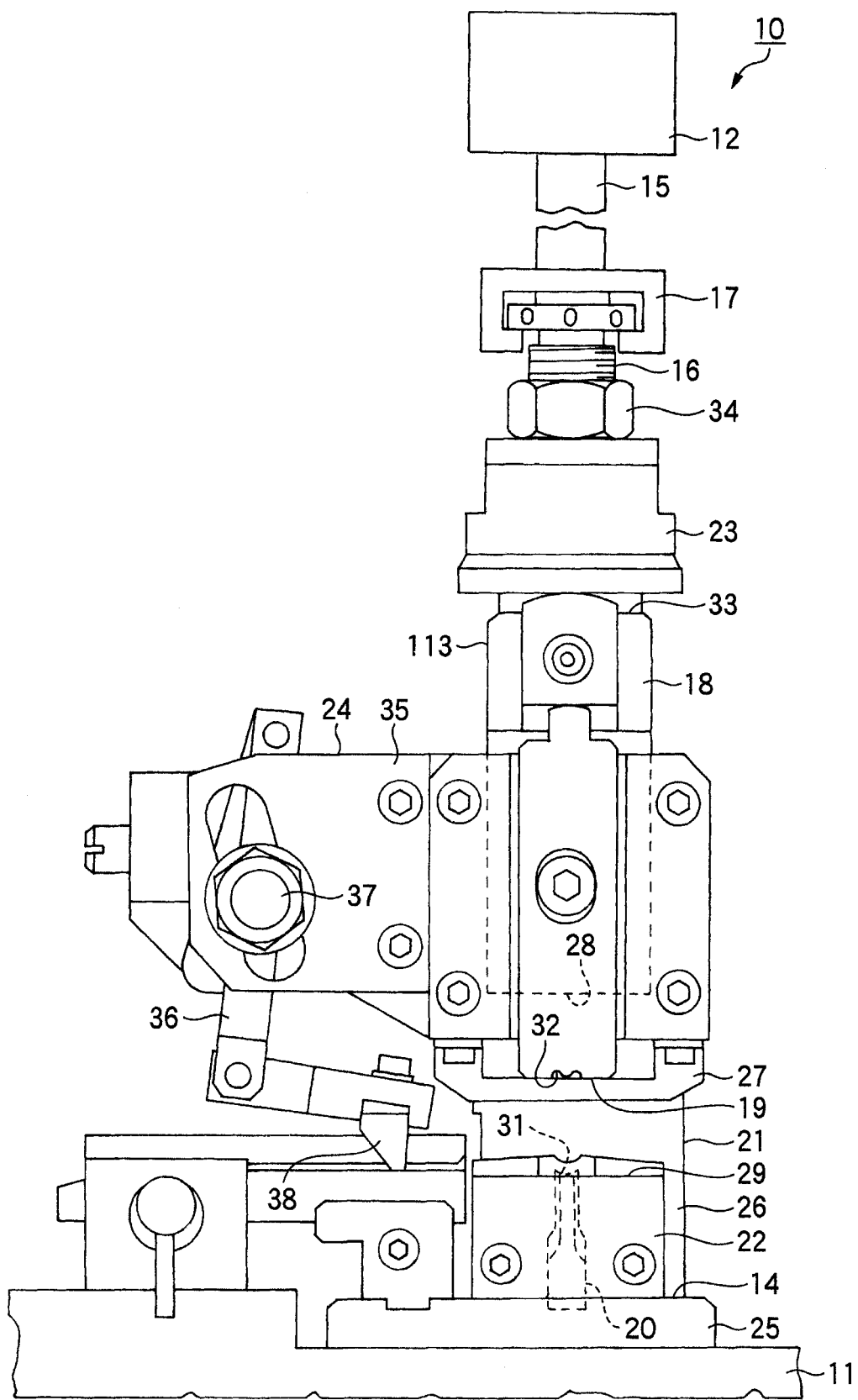
FIG. 2 is a front-elevational view of a crimping machine incorporated in the wire-connected metal terminal measuring apparatus of FIG. 1.

As shown in FIG. 2, the crimping apparatus 10 comprises a base 11 installed on a floor or the like, a drive source 12, and an applicator for crimping 113. The base 11 has a flat portion 14 which is generally flat in a horizontal direction. The crimping member 13 is placed and supported on the base 11.

The drive source 12 comprises a servomotor (not shown), a drive shaft 15 for transmitting a driving force, and a hook 17 engaged with a disk portion (not shown) of a shank 16. A rotational motion of the servomotor is converted into a linear motion via a piston-crank mechanism so as to move a ram 18 upward and downward. Instead of the servomotor of the drive source 12, a hydraulic cylinder having a piston rod connected to the shank 16 in directly-driving relation or other suitable drive unit may be used.

The crimping member 13 includes a crimper 19, and an anvil 20. The crimper 19 is moved downward to press-deform crimping piece portions of the metal terminal 40, thereby crimping the metal terminal 40 to the sheathed wire 50.

Figure 3:
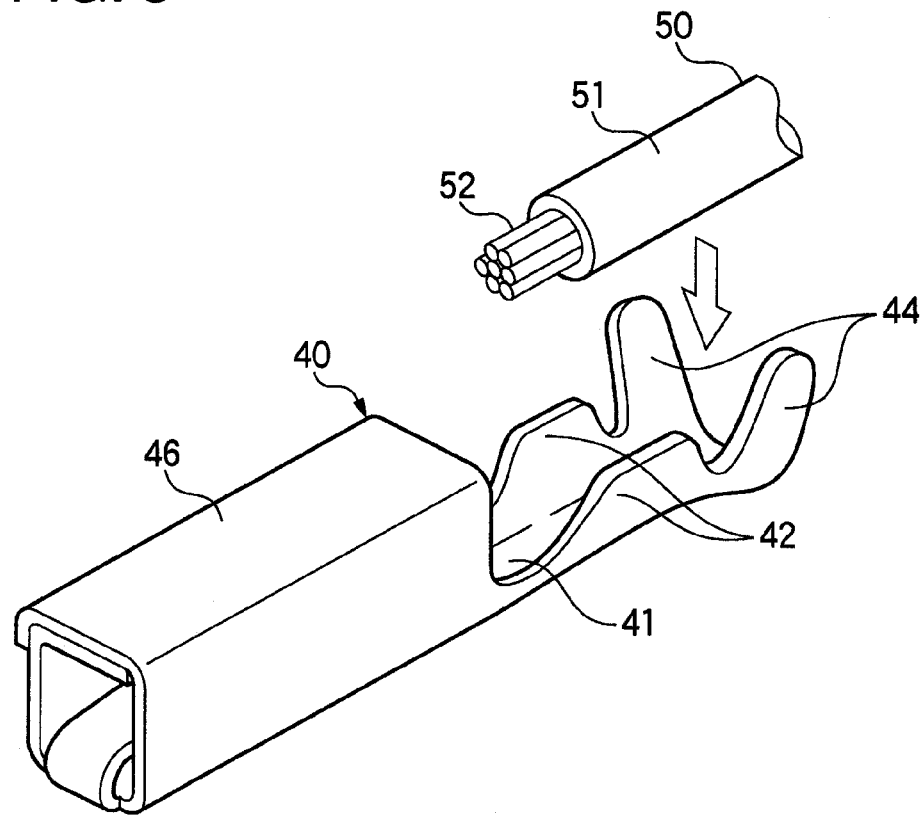
FIG. 3 is a perspective view showing a sheathed wire and a metal terminal to be crimped to the sheathed wire.

As shown in FIG. 3, the metal terminal 40 includes a base plate portion 41, a pair of core wire crimping piece portions 42 extending upwardly respectively from opposite side edges of the base plate portion 41, and a pair of sheath crimping piece portions 44 extending upwardly respectively from the opposite side edges of the base plate portion 41. A sheath 51 is removed from an end portion of the sheathed wire 50, and an exposed potion of a core wire 52 and that portion of the sheath 50 disposed adjacent to this exposed core wire portion are placed on the base plate portion 41. The pair of core wire crimping piece portions 42 are press-fastened to the core wire 52 of the sheathed wire 50 placed on the base plate portion 41, and the pair of sheath crimping piece portions 44 are press-fastened to the sheath 51 of the sheathed wire 50 placed on the base plate portion 41, thereby crimping the metal terminal 40 to the sheathed wire 50.

Various forms of metal terminals can be used as the metal terminal 40 in so far as the metal terminal includes at least a pair of core wire crimping piece portions to be press-fastened to the core wire of the sheathed wire, and a pair of sheath crimping piece portions to be press-fastened to the sheath. Although the illustrated metal terminal is a female metal terminal having a box-like electrical contact portion 46 formed at one end of the base plate portion 41, a male metal terminal having a tab-like electrical contact portion, a joint metal terminal for connecting two wires together, or any other suitable metal terminal can be used.

Metal terminals 40 are formed by forming a base sheet (comprising an electrically-conductive metal sheet) into a predetermined shape by blanking and then by bending it, and a plurality of metal terminals 40 are interconnected at equal intervals at their one ends (in a cantilever manner) by a strip-like carrier, and are fed in this chain-like form to the crimping apparatus 10.

Referring again to FIG. 2, with respect to the upward and downward movement of the crimper 19 which can press-deform the pair of core wire crimping piece portions 42 and the pair of sheath crimping piece portions 44, a rotational motion of the servomotor is converted into a linear motion by the piston-crank mechanism so as to move the ram 18 (holding the crimper 19) upward and downward, thereby moving the crimper 19 upward and downward.

The crimping member 13 comprises a frame 21, a holder 22 holding the anvil 20, the ram 18 supported on the frame 21, a ram bolt 23 threadedly engaged with the ram 18 so as to enable the upward and downward movement of the ram 18, the shank 16 threadedly engaged with the ram bolt 23, and a terminal feed unit 24.

The frame 21, when viewed from the side thereof, has a generally recumbent U-shape, and includes a mounting portion 25 on which the holder 22 is mounted, an upwardly-extending support post portion 26, and a ram support portion 27. The frame 21 is placed on the flat portion 14 of the base 11, and is fixed thereto to bolts and nuts (not shown). The frame 21 may be integrally fixed to the base 11.

The ram support portion 27 is connected to an upper end portion of the support post portion 26 extending upwardly from the mounting portion 25 on which the holder 22 is mounted. A space for guiding the ram 18 is formed in the ram support portion 27, and the ram 18 is slidably fitted in this space.

The anvil 20 for the placing of the metal terminal 40 thereon is embedded in the holder 22. The holder 22 has a flat surface 29 opposed to both of the crimper 19 and a lower end surface 28 of the ram 18.

The anvil 20 is received and held in the holder 22, and in this condition the holder 22 is mounted on the mounting portion 25 of the frame 21. The anvil 20 is held in the holder 22, with its bottom plate disposed in intimate contact with a bottom wall of the holder 22, and therefore the anvil 20 can support the metal terminal 40 on its upper surface without being shaken.

The ram 18 is supported in the ram support portion 27 so as to move upward and downward in the vertical direction. The lower end surface 28 of the ram 18 is flat, and is perpendicular to the direction of movement of the ram 18. The crimper 19 is provided at a lower half portion of the ram 18 in opposed relation to the anvil 20.

The crimper 19 is in the form of a generally rectangular parallelepiped-shaped plate, and a groove 32 is formed in that surface of the crimper 19 opposed to the anvil 20. An inner surface of the groove 32 is formed into a curved shape so as to press-deform the pair of core wire crimping piece portions 42 and the pair of sheath crimping piece portions 44 of the metal terminal 40 into predetermined shapes The shank 16 has a hollow cylindrical shape. The disk portion formed at one end of the shank 16 is connected to the hook 17 of the drive source 12, and a screw portion formed at the other end of the shank 16 is threaded in a screw hole in the ram bolt 23. Namely, the shank 16 transmits a driving force of the drive source 12 to the ram 18 via the ram bolt 23 (threaded in a threaded hole formed in an upper end surface 33 of the ram 18) so as to move the crimper 19 upward and downward.

The amount of threading of the shank 16 in the screw hole of the ram bolt 23 can be adjusted, and therefore the shank 16 is mounted on the ram bolt 23 in such a manner that the position of the shank 16 relative to the ram bolt 23 can be changed. When the position of the shank 16 relative to the ram bolt 23 is changed by adjusting the amount of threading of the shank 16 in the screw hole of the ram bolt 23, the distance (gap) between the anvil 20 and the crimper 19 is also changed.

The shank 16 has a nut 34 threaded on an externally-threaded portion thereof, and the nut 34 is tightened, with the shank 16 threaded in the screw hole of the ram bolt 23, and by doing so, the ram bolt 23 and the shank 16 can be fixed to each other.

The terminal feed unit 24 comprises a cam (not shown) provided at a side portion of the ram 18, a connecting rod (not shown) adapted to abut against the cam to be moved in the horizontal direction, a lever support portion 35 receiving the connecting rod therein, a crank-like lever 36 fitted in the lever support portion 35, a pivot shaft 37 supporting the lever 36 in a manner to allow a pivotal movement of the lever 36, and a terminal feed claw 38 provided at a distal end portion of the lever 36.

In the terminal feed unit 24, the cam is moved downward by the driving force of the drive source 12, and at this time the connecting rod abuts at its one end against the cam, and is pushed to be moved in the horizontal direction, so that the other end portion of the connecting rod is brought into abutting engagement with the lever 36, and the lever 36 is pivotally moved about the pivot shaft 37. As a result, the terminal feed claw 38 is engaged in a feed hole in the carrier, and feeds one metal terminal at a time in a terminal feeding direction.

The metal terminal 40 is fed by the terminal feed unit 24, and is placed on the anvil 20. Then, the sheathed wire 50 is placed on the base plate portion 41. When the crimper 19 is moved downward, the inner surface of the groove 32 is brought into abutting engagement with the pair of core wire crimping piece portions 42 and the pair of sheath crimping piece portions 44. The metal terminal 40 is pressed between the crimper 19 and the anvil 20, and the pair of core wire crimping piece portions 42 as well as the pair of sheath crimping piece portions 44 are slid on the inner surface of the groove 32, and are inwardly curved to be press-deformed (that is, press-fastened to the relevant portion of the sheathed wire).

A support surface of the anvil 20 on which the metal terminal 40 is adapted to be placed is formed into a concavely-curved surface having an arc-shaped contour in a cross-section perpendicular to the axis of the sheathed wire 50. During the time when the pair of core wire crimping piece portions 42 and the pair of sheath crimping piece portions 44 are press-deformed, the base plate portion 41 held in contact with the support surface of the anvil 20 is curved into a shape corresponding to the shape of the support surface of the anvil 20.

Figure 4:
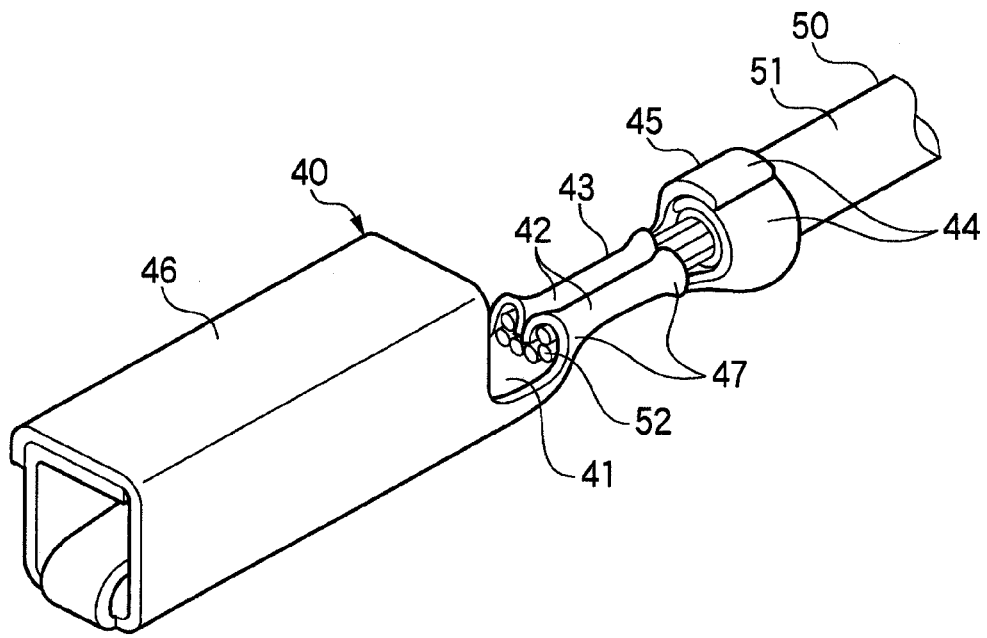
FIG. 4 is a perspective view of the wire-connected metal terminal, that is, the metal terminal of FIG. 3 crimped to the sheathed wire.

As shown in FIG. 4, the pair of core wire crimping piece portions 42 are press-fastened to the core wire 52 symmetrically with respect to a plane. A core wire crimping portion 43 formed by the pair of core wire crimping piece portions 42 and 42 press-fastened to the core wire 52 is formed into a flattened shape (in a cross-section perpendicular to the axis of the sheathed wire 50) such that its height in a direction perpendicular to the base plate portion 41 is smaller than its width. Each of opposite end portions of each core wire crimping piece portion 42 of the core wire crimping portion 43 is formed into a flaring shape (resembling a bell of a trumpet), so that bell mouth portions 47 are formed respectively at the opposite end portions of the core wire crimping portion 43.

The pair of sheath crimping piece portions 44 are press-fastened to the sheath 51 in such a manner that one of these sheath crimping piece portions 44 overlaps the other. A sheath crimping portion 45 formed by the pair of sheath crimping piece portions 44 press-fastened to the sheath 51 has a generally round shape in a cross-section perpendicular to the axial of the sheathed wire 50.

Referring again to FIG. 1, the metal terminal 40 crimped to the sheathed wire 50 by the crimping apparatus 10 is cut from the carrier, and is conveyed to the measuring device 60, for example, with the electrical contact portion 46 held by a holding member.

In the measuring device 60 of this embodiment, first, whether or not any back burr is formed on the metal terminal 40 is checked by using image processing or a probe. If the existence of such back burr or burrs is confirmed, for example, the operation of the crimping apparatus 10 is stopped, and a necessary operation is effected such as an operation for adjusting the gap between the crimper 19 and the anvil 20 of the crimping apparatus 10.

Figure 5:
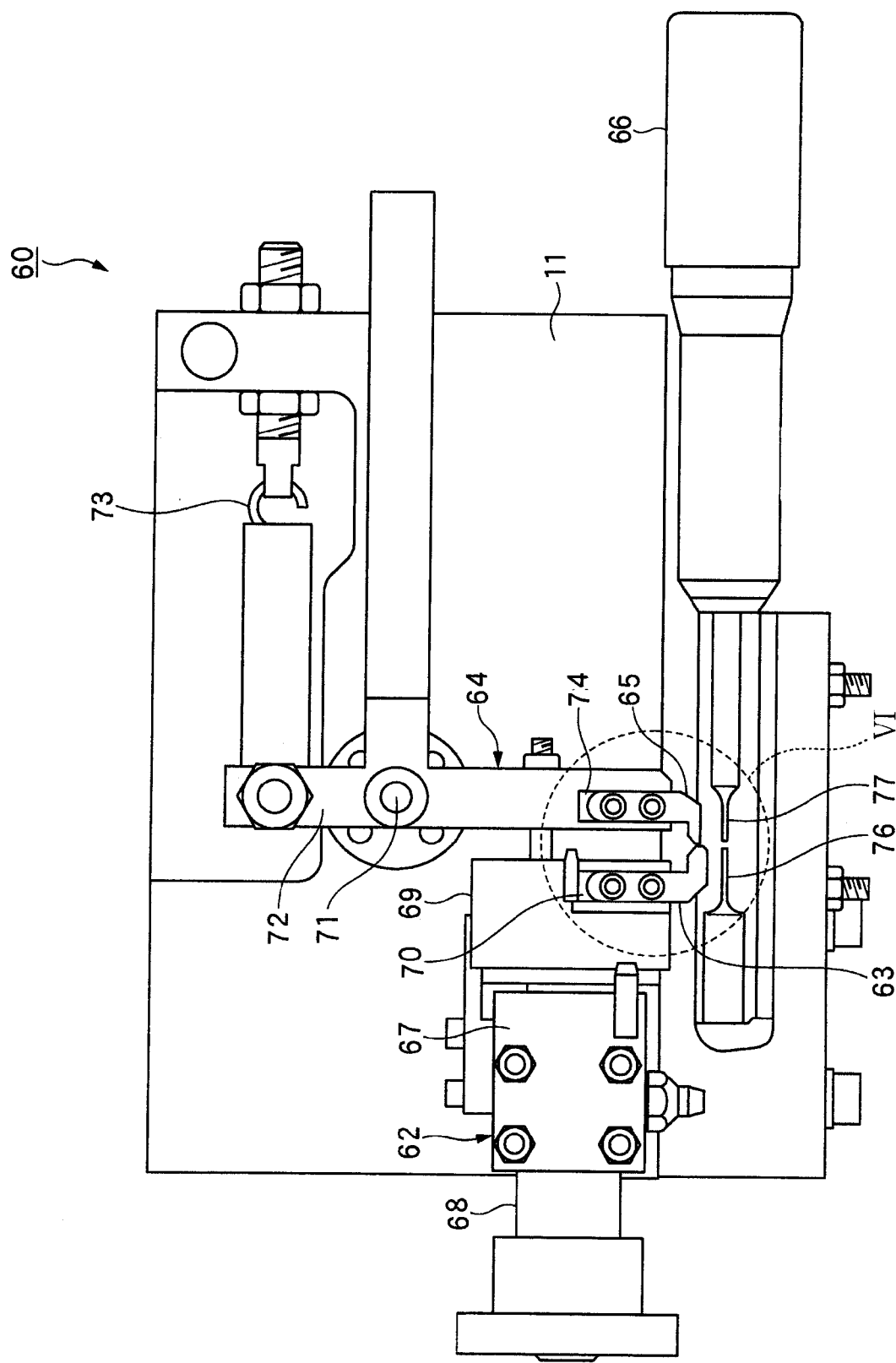
FIG. 5 is a plan view of a measuring device incorporated in the wire-connected metal terminal measuring apparatus of FIG. 1.

Then, a height of the core wire crimping portion 43 of the metal terminal 40 and a height of the sheath crimping portion 45 of the metal terminal 40 are measured. As shown in FIG. 5, the measuring device 60 includes a linear movement mechanism portion 62, a pivotal movement mechanism portion 64 and a measuring portion 66 for measuring a height of a sheath crimping portion of the metal terminal. The pivotal movement mechanism portion 64 and the measuring portion 66 grip a core wire crimping portion of the metal terminal crimped to the sheathed wire and jointly form a first measuring unit for measuring the height of the core wire crimping portion 43.

The linear movement mechanism portion 62 includes a linear movement shaft 68 passing through a shaft support member 67 fixed to the base 11. The linear movement shaft 68, when rotated about its axis, is moved forward and rearward in the axial direction so as to move a moving member 69, fixed to a distal end of the linear movement shaft 68, forward and rearward. A first gripping member 63 is fixed to a first gripping member mounting portion 70 formed at an end portion of the moving member 69.

The pivotal movement mechanism portion 64 includes an arm 72 pivotally mounted on a pivot shaft 71 fixed to the base 11. One end of the arm 72 is connected to the base 11 via a spring 73, and a second gripping member mounting portion 74 is formed at the other end portion of the arm 72. A second gripping member 65 is fixed to the second gripping member mounting portion 74.

The first gripping member 63 as well as the second gripping member 65 is formed into a generally L-shape, and the first and second gripping members 63 and 65 are arranged symmetrically in such a manner that their distal ends are opposed to each other. The core wire crimping portion 43 of the metal terminal 40 is held between the distal end of the first gripping member 63 and the distal end of the second gripping member 65, and the height H1 (see FIG. 8) of the core wire crimping portion 43 is measured.

Figure 6:
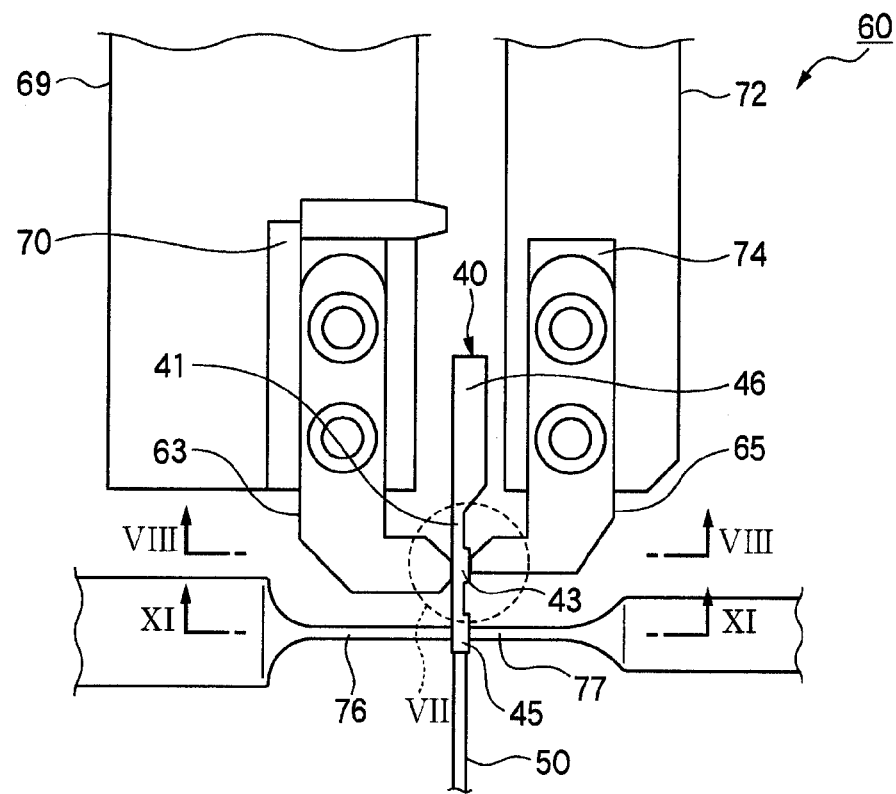
FIG. 6 is an enlarged plan view of a portion of FIG. 5 encircled by a broken-line circle VI.

As shown in FIG. 6, the core wire crimping portion 43 is interposed and held between the distal end of the first gripping member 63 and the distal end of the second gripping member 65 in such a manner that the distal end of one of the first and second gripping members 63 and 65 perpendicularly abuts against the base plate portion 41. In this embodiment, the distal end of the first gripping member 63 perpendicularly abuts against the base plate portion 41.

Figure 7:
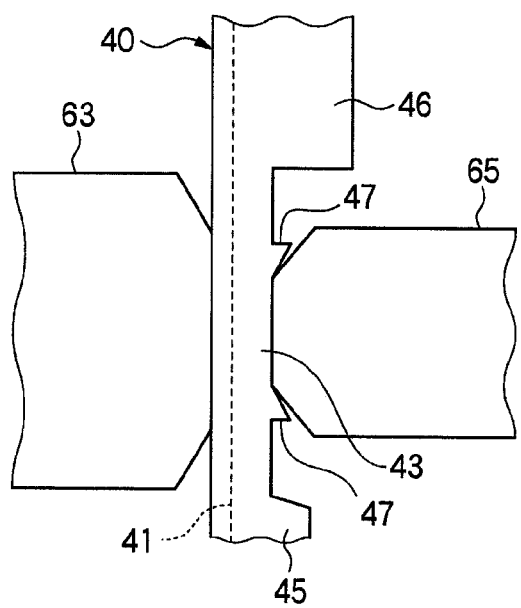
FIG. 7 is an enlarged plan view of a portion of FIG. 6 encircled by a broken-line circle VII.

As shown in FIG. 7, each of the opposite end portions of the core wire crimping piece portion 42 of the core wire crimping portion 43 is formed into the flaring shape (resembling a bell of a trumpet), so that the bell mouth portions 47 are formed respectively at the opposite end portions of the core wire crimping portion 43. Opposite side edges of the distal end portion of the second gripping member 65 (this is, other gripping member than the first gripping member 63 for abutting against the base plate portion 41) abut respectively against the bell mouth portions 47, thereby effecting the positioning of the metal terminal 40 in the axial direction of the sheathed wire 50.

Figure 8:
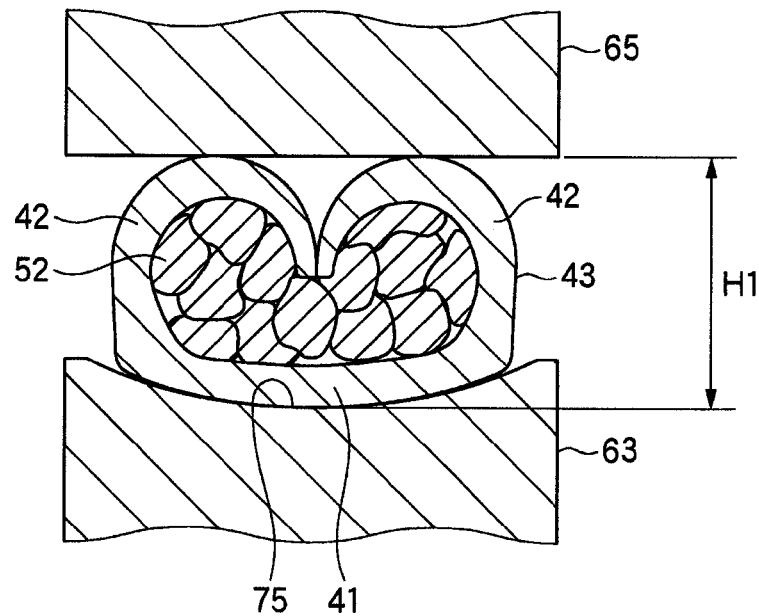
FIG. 8 is a cross-sectional view taken along the line VIII-VIII of FIG. 6.

As shown in FIG. 8, the base plate portion 41 is formed into a convexly-curved shape in a cross-section perpendicular to the axis of the sheathed wire 50, and a concave groove 75 conforming in shape (curved shape) to the base plate portion 41 is formed at the distal end of the first gripping member 63 for abutting against the base plate portion 41. The base plate portion 41 and the concave groove 75 of the first gripping member 63 are fitted together in a complementary manner, thereby effecting the positioning of the metal terminal 40 in a direction perpendicular to the axis of the sheathed wire 50.

A resilient force of the spring 73 acts on the arm 72 to which the second gripping member 65 is fixed, and this resilient force urges the second gripping member 65 toward the first gripping member 63. Therefore, the core wire crimping portion 43 of the metal terminal 40 is sandwiched between the distal end of the first gripping member 63 and the distal end of the second gripping member 65, so that the height H1 of the core wire crimping portion 43 is measured, and at the same time the core wire crimping portion 43 is held between (or gripped by) the distal ends of the first and second gripping members 63 and 65. Incidentally, the timing of measuring the height H1 and the timing of holding the core wire crimping portion 43 are not limited. The core wire crimping portion 43 may be held between the distal ends of the first and second gripping members 63 and 65 after the height H1 of the core wire crimping portion 43 is measured by sandwiching the core wire crimping portion 43 of the metal terminal 40 between the distal end of the first gripping member 63 and the distal end of the second gripping member 65.

Referring again to FIG. 5, the measuring device 60 further includes a fixing-side measuring element 76, and a movable measuring element 77 disposed coaxially with the fixing-side measuring element 76 and movable forward and rearward, that is, toward and away from the fixing-side measuring element 77 in a direction of an axis thereof. The fixing-side measuring element 76 and the movable measuring element 77 jointly form a second measuring unit for measuring a height H2 (see FIG. 9) of the sheath crimping portion 45.

The fixing-side measuring element 76 and the movable measuring element 77 are arranged such that the common axis of these measuring elements 76 and 77 intersects the direction of gripping of the core wire crimping portion 43 by (that is, the direction of holding of the core wire crimping portion 43 between) the distal ends of the first and second gripping members 63 and 65 at a predetermined angle, or is disposed parallel to this gripping direction. In this embodiment, the common axis is disposed parallel to the gripping direction.

Figure 9:
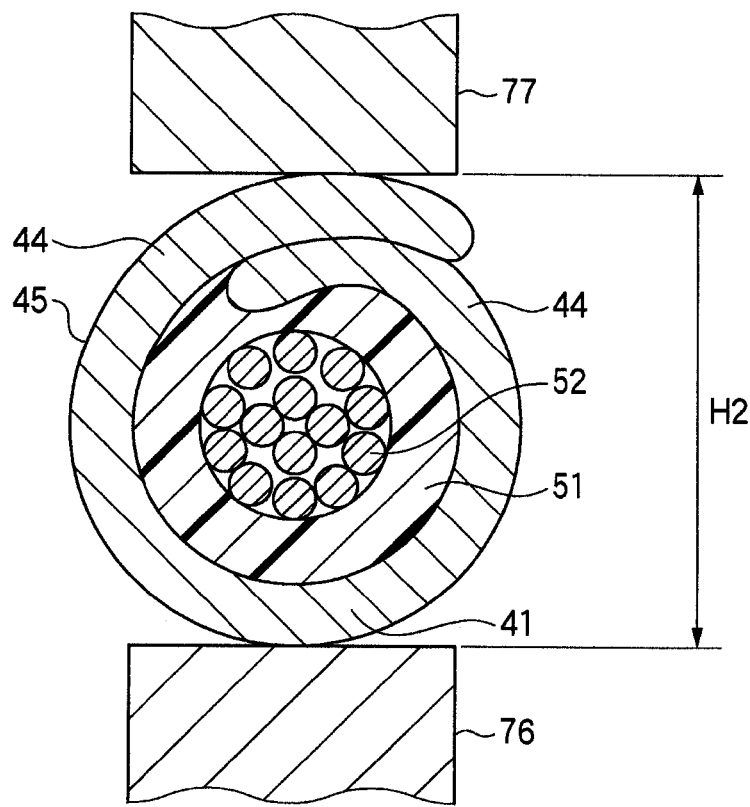
FIG. 9 is a cross-sectional view taken along the line IX-IX of FIG. 6.

As shown in FIG. 9, the movable measuring element 77 is moved forward in its axial direction, and the sheath crimping portion 45 is held between the movable measuring element 77 and the fixing-side measuring element 76, so that the height H2 of the sheath crimping portion 45 is measured.

When at least one of the heights H1 and H2 of the core wire crimping portion 43 and sheath crimping portion 45 is outside a predetermined standard range, for example, the operation of the crimping apparatus 10 is stopped, and a necessary operation is effected such for example as an operation for adjusting the gap between the crimper 19 and the anvil 20 of the crimping apparatus 10. The measuring device 60 may incorporate a control unit for automatically feeding a signal for stopping the operation of the crimping apparatus 10 when it is confirmed that the metal terminal 50 has back burr or burrs or when at least one of the heights H1 and H2 of the core wire crimping portion 43 and sheath crimping portion 45 is outside the predetermined standard range.

As described above, in the apparatus of this embodiment for measuring the wire-connected metal terminal and also in the method of measuring the wire-connected metal terminal by this apparatus, the height H1 of the core wire crimping portion 43 is defined as its dimension in the direction perpendicular to the base plate portion 41, and the height H1 of the core wire crimping portion 43 is measured while the core wire crimping portion 43 is gripped in the direction perpendicular to the base plate portion 41. Here, base plate portions 41 of all of metal terminals 40 to be subjected to measurement have the same shape, and therefore the metal terminals 40, each having the core wire crimping portion 43 gripped in the direction perpendicular to the base plate portion 41, are all held in the same posture. In the condition in which the core wire crimping portion 43 is gripped in the direction perpendicular to the base plate portion 41, the height H2 of the sheath crimping portion 45 is measured in the direction intersecting the direction of gripping of the core wire crimping portion 43 at the predetermined angle or disposed parallel to this gripping direction. By doing so, a portion (measurement portion) of the sheath crimping portion 45 to be measured can be standardized for all of the metal terminals 40 to be subjected to measurement. Therefore, the measurement of the height H2 of the sheath crimping portion 45 can be effected in a stable manner, and the clamping force of the wire-connected metal terminal 40 can be properly evaluated so as to enhance the quality of the wire-connected metal terminal 40.

In order to prevent the core wire 52 from being damaged by the pair of core wire crimping piece portions 42 press-fastened thereto, each of the opposite end portions of each core wire crimping piece portion 42 of the core wire crimping portion 43 is formed into the flaring shape, so that the bell mouth portions 47 are formed respectively at the opposite end portions of the core wire crimping portion 43 spaced from each other in the axial direction of the sheathed wire 50. The distal end portion of the second gripping member 65 (forming the measuring unit for gripping the core wire crimping portion 43 to measure the height H1 thereof) abuts against the bell mouth portions 47. By doing so, the positioning of the metal terminal 40 in the axial direction of the sheathed wire 50 can be effected.

Furthermore, the base plate portion 41 of the metal terminal 40 is formed into the arcuately-curved shape in the cross-section perpendicular to the axis of the sheathed wire 50, and the concave groove 75 conforming in shape (curved shape) to the base plate portion 41 is formed at the distal end surface (for contact with the base plate portion 41) of the first gripping member 63 forming the measuring unit for gripping the core wire crimping portion 43 to measure the height H1 thereof. When the measuring unit grips the core wire crimping portion 43 to measure the height H1 thereof, the base plate portion 41 and the concave groove 75 are fitted together in a complementary manner. By doing so, the positioning of the metal terminal 40 in the direction perpendicular to the axis of the sheathed wire 50 can be effected.

The present invention is not limited to the above embodiment, and various modifications, improvements, etc., can be suitably made. Furthermore, the material, shape, dimensions, numerical value, form, number, disposition, etc., of each of the constituent elements of the above embodiment are arbitrary, and are not limited in so far as the invention can be achieved.

The present application is based on Japan Patent Application No. 2007-009138 filed on Jan. 18, 2007 and Japan Patent Application No. 2007-009130 filed on Jan. 18, 2007, the contents of which are incorporated herein for reference.

What is claimed is:

1. A method of measuring a metal terminal, comprising:
providing a metal terminal which includes a base plate portion for placing a sheathed electric wire thereon, a pair of core wire crimping piece portions extending upwardly respectively from opposite side edges of the base plate portion, and a pair of sheath crimping piece portions extending upwardly respectively from the opposite side edges of the base plate portion; and
crimping the core wire crimping piece portions to a core wire of the sheathed electric wire to form a core wire crimping portion;
crimping the sheath crimping piece portions to a sheath portion of the sheathed electric wire to form a sheath crimping portion;
measuring a dimension of the core wire crimping portion and a dimension of the sheath crimping portion,
wherein a height of the sheath crimping portion is measured in a direction intersecting with or parallel to a direction of gripping of the core wire crimping portion in a state that the core wire crimping portion is gripped in a direction perpendicular to an extending direction of the base plate portion.

2. The method according to claim 1, wherein when the sheath crimping portion is formed, one of the sheath crimping piece portions is overlapped to the other of the sheath crimping piece portions.

3. The method according to claim 1, wherein a bell mouth portion is formed at an end portion of the core wire crimping portion in an axis direction of the sheathed electric wire; and
wherein a positioning of the metal terminal is determined by gripping the core wire crimping portion with a gripping member so as to abut against the bell mouth portion.

4. The method according to claim 1, wherein the base plate portion is formed into a curved shape in a cross-section perpendicular to an axis direction of the sheathed electric wire;

wherein the core wire crimping portion is gripped by a gripping member;

wherein the gripping member includes a concave groove having a shape conforming to the curved shape of the base plate portion; and wherein a positioning of the metal terminal is determined by contacting the concave groove of the gripping member to the base plate portion.

5. The method according to claim 1, wherein the measuring process includes:

measuring a height of the core wire crimping portion while gripping the core wire crimping portion in the direction perpendicular to the extending direction of the base plate portion; and measuring the height of the sheath crimping portion in the direction intersecting with or parallel to the direction of gripping of the core wire crimping portion in the state that the core wire crimping portion is gripped in the measuring process of the height of the core wire crimping portion.

6. The method according to claim 1, wherein when it is detected in the crimping process that a back burr is formed on the metal terminal, an operation of the crimping process is stopped.

7. The method according to claim 1, wherein when the height of at least one of the core wire crimping portion and the sheath crimping portion does not meet a predetermined standard requirement, an operation of the crimping process is stopped.

8. An apparatus for measuring a metal terminal including a base plate portion for placing a sheathed electric wire thereon, a pair of core wire crimping piece portions extending upwardly respectively from opposite side edges of the base plate portion, and a pair of sheath crimping piece portions extending upwardly respectively from the opposite side edges of the base plate portion; the apparatus comprising:

a crimping unit which crimps the core wire crimping piece portions to a core wire of a sheathed electric wire to form a core wire crimping portion and crimps the sheath crimping piece portions to a sheath portion of the sheathed electric wire to form a sheath crimping portion;

a gripping member which grips the core wire crimping portion in a direction perpendicular to an extending direction of the base plate portion; and a measuring unit which measures a dimension of the core wire crimping portion and a dimension of the sheath crimping portion, wherein a height of the sheath crimping portion is measured in a direction intersecting with or parallel to the direction of gripping of the core wire crimping portion in a state that the core wire crimping portion is gripped in a direction perpendicular to an extending direction of the base plate portion.

9. The apparatus according to claim 8, wherein one of the sheath crimping piece portions in the sheath crimping portion is overlapped to the other of the sheath crimping piece portions.

10. The apparatus according to claim 8, wherein the gripping member has an abutment portion which abuts against a bell mouth portion which is formed at an end portion of the core wire crimping portion in an axis direction of the sheathed electric wire.

11. The apparatus according to claim 8, wherein the gripping member includes a concave groove having a shape conforming to a curved shape of the base plate portion which is formed into a curved shape in a cross-section perpendicular to an axis direction of the sheathed electric wire.

12. The apparatus according to claim 8, wherein the measuring unit includes:

a first measuring portion which measures a height of the core wire crimping portion while gripping the core wire crimping portion in the direction perpendicular to the extending direction of the base plate portion; and a second measuring portion which measures the height of the sheath crimping portion in the direction intersecting with or parallel to the direction of gripping of the core wire crimping portion in the state that the core wire crimping portion is gripped in the measuring process of the height of the core wire crimping portion.

13. The apparatus according to claim 8, wherein when it is detected in the crimping process that a back burr is formed on the metal terminal, an operation of the crimping unit is stopped.

14. The apparatus according to claim 8, wherein when the height of at least one of the core wire crimping portion and the sheath crimping portion does not meet a predetermined standard requirement, an operation of the crimping unit is stopped.

* * * * *